United States Patent [19]

Schranz

[11] Patent Number: 5,523,064
[45] Date of Patent: Jun. 4, 1996

[54] CRYSTALLIZATION APPARATUS

[75] Inventor: Martin B. Schranz, Glenwood, Ill.

[73] Assignee: Swenson Process Equipment, Inc., a Delaware Corp., Harvey, Ill.

[21] Appl. No.: 333,271

[22] Filed: Nov. 2, 1994

[51] Int. Cl.⁶ .................................................. C30B 35/00
[52] U.S. Cl. ........................................ 422/245.1; 422/251
[58] Field of Search ............................. 422/245.1, 251, 422/252, 254; 23/295 R

[56] References Cited

U.S. PATENT DOCUMENTS

| | | | |
|---|---|---|---|
| 3,193,361 | 7/1965 | Niedner | 422/252 |
| 3,599,701 | 8/1971 | Mollerstedt et al. | 159/47.1 |
| 3,617,382 | 11/1971 | Lisle et al. | 127/15 |
| 3,762,947 | 10/1973 | Ornstein et al. | 127/15 |
| 3,883,311 | 5/1975 | Kanai et al. | 422/252 |
| 4,231,991 | 11/1980 | Muller | 422/245.1 |
| 4,318,772 | 3/1982 | Kragh | 210/712 |
| 5,410,984 | 5/1995 | Pikus et al. | 117/204 |

*Primary Examiner*—R. Bruce Breneman
*Assistant Examiner*—Felisa Garrett
*Attorney, Agent, or Firm*—Lockwood, Alex, Fitzgibbon & Cummings

[57] ABSTRACT

A surface-cooled fluid bed crystallizer apparatus and method are disclosed wherein submerged heat exchanger surfaces (typically heat exchanger tubes or plates through which a coolant is passed) are bathed with a stream of gas bubbles (preferably air). The gas bubbles increase localized velocity at the heat exchanger surfaces, improves heat transfer, reduces crystallization on the heat exchanger surfaces and gently keeps the crystals in suspension, thereby avoiding unwanted nucleation as is characterized by the use of mechanical circulation devices. By continuously removing the depleted magma and crystals, the crystallizer can be operated in a continuous mode.

15 Claims, 6 Drawing Sheets

CRYSTALLIZATION APPARATUS

BACKGROUND AND DESCRIPTION OF THE INVENTION

This invention generally relates to an apparatus and method for providing improved heat transfer in systems wherein heat transfer surfaces are present in a body of slurry. More particularly, this invention is directed to an improved crystallization apparatus and method wherein gas bubbles are used to provide improved heat transfer in crystallization systems wherein heat exchange surfaces are submerged in a slurry body. In this regard, an important aspect of this invention is directed to a new and improved surface-cooled fluid bed crystallizer which includes a gas distributor that discharges gas bubbles (typically air) upwardly through the magma onto and around heat exchanger tubes or plates contained therein to provide improved heat transfer between the cooling liquid and magma and economical production of a crystal product of desired particle size.

Surface-cooled crystallization systems utilizing heat exchanger surfaces (e.g. heat exchanger tubes or plates) submerged in a slurry contained in a vessel have been commonly utilized in applications where the temperature level is low making vacuum crystallization impractical or where the solution boiling point elevation is high. Typically, these systems operate at atmospheric pressure and are characterized by relatively poor heat transfer rates brought about, in part, by the build-up of crystals on the heat exchanger surfaces and relatively low fluid velocity at the heat exchanger surfaces.

Efforts to overcome some of the disadvantages of the aforementioned surface-cooled crystallizers have involved the use of mechanical agitation devices. For example, in an agitated batch crystallizer, water is circulated through the cooling coils and a solution is agitated by propellers on a central shaft. This agitation increases the rate of heat transfer and tends to keep the temperature of the solution more uniform. Additionally, it serves to keep the fine crystals in suspension, giving them an opportunity to grow uniformly instead of forming large crystals or aggregates. Shock imposed by the mechanical agitation device, however, introduces unwanted nucleation resulting in the formation of product crystals which are smaller in size. Other disadvantages of the agitated batch crystallizers are that the system is a batch or discontinuous method and also that the solubility is lowest in the stagnant film on the surface of the cooling coils. Consequently, crystal growth is most rapid at this point and the coils rapidly build-up a mass of crystals which serve to decrease the rate of heat transfer.

The use of air agitation in prior art crystallization processes has generally involved the introduction of such air in locations in the slurry body wherein no heat exchange surfaces are present. For example, U.S. Pat. No. 3,599,701 describes a system wherein air is injected into a slurry in a crystallization zone for the purpose of concentrating the slurry and creating sufficient turbulence in the crystallization zone for preventing or minimizing classification so that all areas in the crystallization zone have a substantially uniform composition. Similarly, U.S. Pat. No. 3,883,311 describes a reaction crystallizer which utilizes an air distributor located below a draft tube contained within a body of slurry. Neither of these references utilizes air bubbles to bathe any heat exchanger surfaces.

In accordance with an important aspect of the present invention, the problems and disadvantages of these prior art crystallizer systems are overcome by providing a surface-cooled crystallization apparatus and method wherein submerged heat exchange surfaces are bathed with a stream of gas bubbles. In particular, the heat exchange surfaces (heat exchange tubes or plates) through which a coolant, such as cold water or brine is passed, are submerged in a body of slurry. The coolant establishes or maintains the magma at crystallization facilitating temperatures and a gas distributor located below the heat exchange surfaces produces a supply of bubbles of a gas, preferably air, which rise upwardly through the slurry body onto and around the heat exchange surfaces. This gas increases the localized velocity at the heat exchange surfaces, improves heat transfer, reduces crystallization on the heat exchange walls and gently keeps the crystals in suspension thereby avoiding unwanted nucleation as is characterized by the use of mechanical circulation devices. This use of the gas bubbles enables the conversion of a quiescent crystallizer into a crystallizer with agitation without the drawback associated with the use of mechanical agitation. Further, by continuously removing the depleted magma and crystals, the crystallizer can be operated in a continuous mode.

The present invention also can be advantageously used in other forms of crystallization systems including, for example, systems wherein, instead of air, a reactant gas is utilized to bathe submerged heat exchange tubes or plates through which a cooling or heating medium is passed depending upon whether the particular application requires either the input or removal of heat from the slurry body in order to maintain crystallization conditions therein. As such, the previously noted benefits of this invention are likewise achievable in reactive type crystallizers having heat exchange tubes or plates submerged in a slurry body with a gas distributor located below such heat exchange tubes or plates. The reactant gas is discharged upwardly through the slurry so that it both produces the desired reaction in the slurry body and also bathes such heat exchange surfaces as previously described.

It is, therefore, an important object of the present invention to provide an improved crystallization apparatus and method.

Another object of the present invention is to provide an apparatus and method characterized by improved heat transfer in systems wherein heat exchange surfaces are located within a slurry body and wherein mechanical agitation or forced circulation devices are not required.

Another object of the present invention is to provide an improved crystallization apparatus and method wherein gas bubbles are discharged onto and around heat exchange surfaces located within the slurry body to both agitate the slurry body and to prevent or minimize the formation of crystals on the heat exchange surfaces.

Another object of the present invention is to provide an improved surface-cooled fluid bed crystallizer and method wherein heat exchange tubes or plates through which a coolant is passed are submerged in a magma body in overlying relationship to a gas distributor that discharges gas bubbles upwardly through the slurry body onto and around the heat exchange tubes or plates to provide both improved heat transfer between the cooling liquid and the magma, minimize the formation of crystal particles on the heat exchange tubes or plates, and to impart gentle agitation to the slurry body without incurring unwanted nucleation.

Another object of the present invention is to provide an improved reaction type crystallizer wherein a cooling or heating medium is circulated through heat exchange tubes or plates which are submerged in a slurry body in overlying relation to a gas distributor that is supplied with a reactant gas that produces the desired reaction in the slurry and both agitates the slurry (without requiring mechanical agitation) and prevents or minimizes the formation of crystals on the surfaces of heat exchange tubes or plates.

These and other objects of the present invention will be apparent from the accompanying detailed description thereof taken in conjunction with the drawings in which identical reference numerals have been used to designate like parts and wherein:

FIG. 15 is a schematic interior view of a single cell crystallizer embodying the present invention equipped with a purge/thickening baffle; and, FIG. 16 is a schematic interior view of a single cell crystallizer embodying the present invention equipped with a purge/thickening baffle and an elutriating leg.

Figure 1:
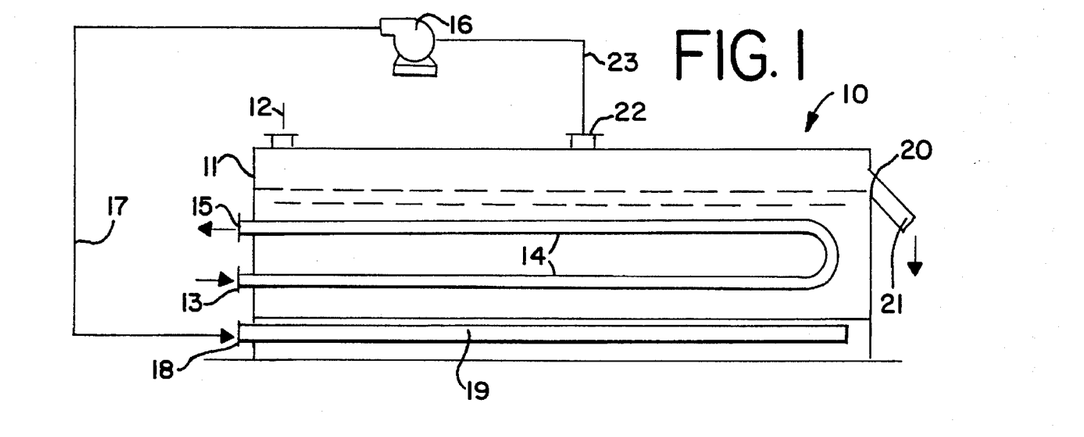
FIG. 1 is a schematic diagram of a surface-cooled fluid bed crystallizer equipped with a gas distributor in accordance with the present invention.
Figure 2:
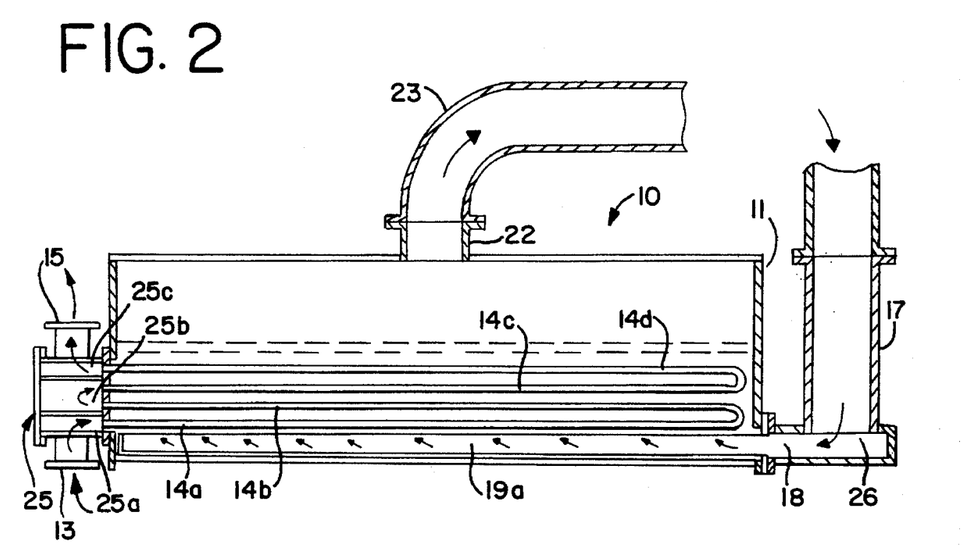
FIG. 2 is a side elevational view of a surface-cooled crystallizer similar to that shown in FIG. 1 illustrating the heat exchanger and air distributor in greater detail.
Figure 3:
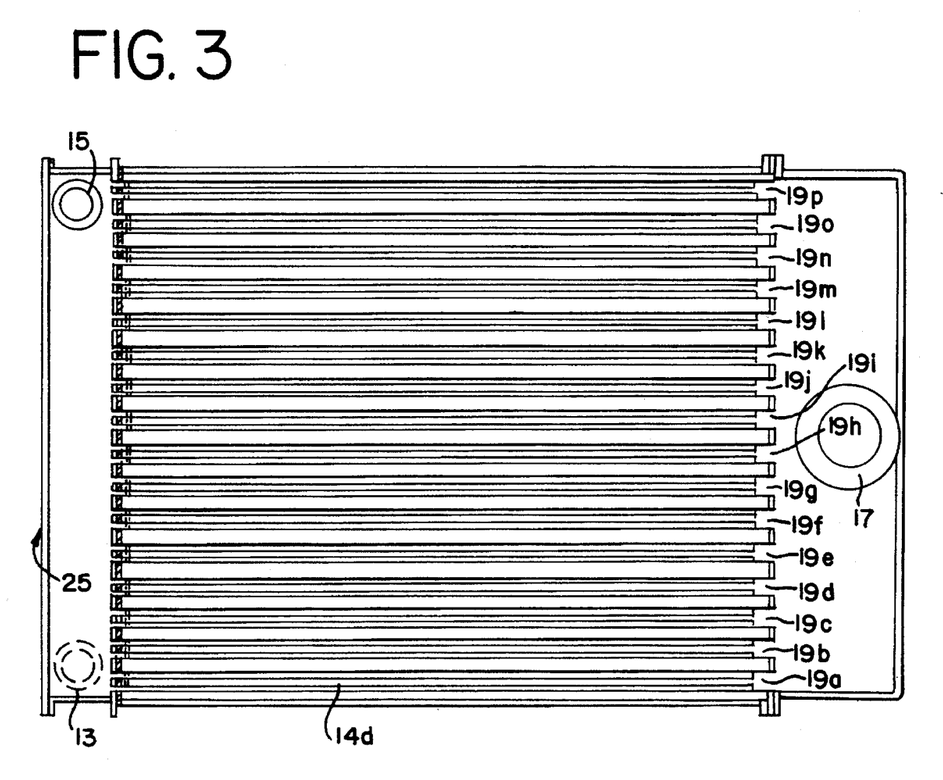
FIG. 3 is a plan view of the surface-cooled crystallizer shown in FIG. 2.
Figure 4:
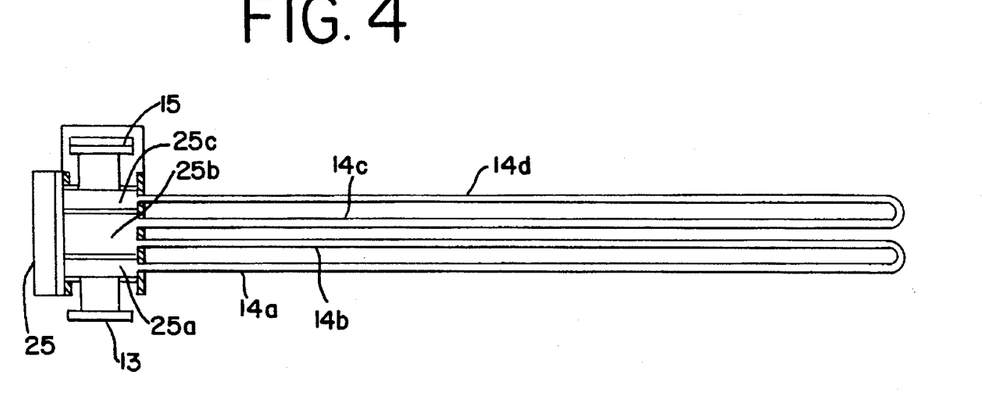
FIG. 4 is a side elevational view of the heat exchanger component in the surface cooled crystallizer shown in FIGS. 2 and 3.
Figure 5:
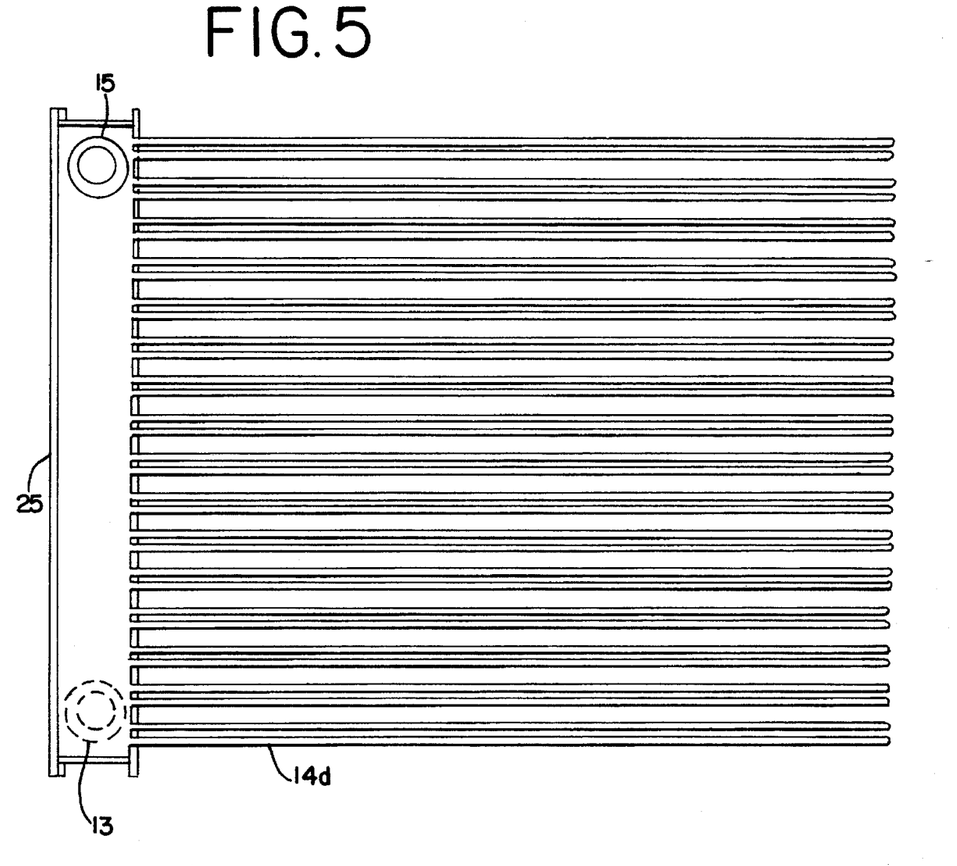
FIG. 5 is a top plan view of the heat exchanger component shown in FIG. 4.
Figure 6:
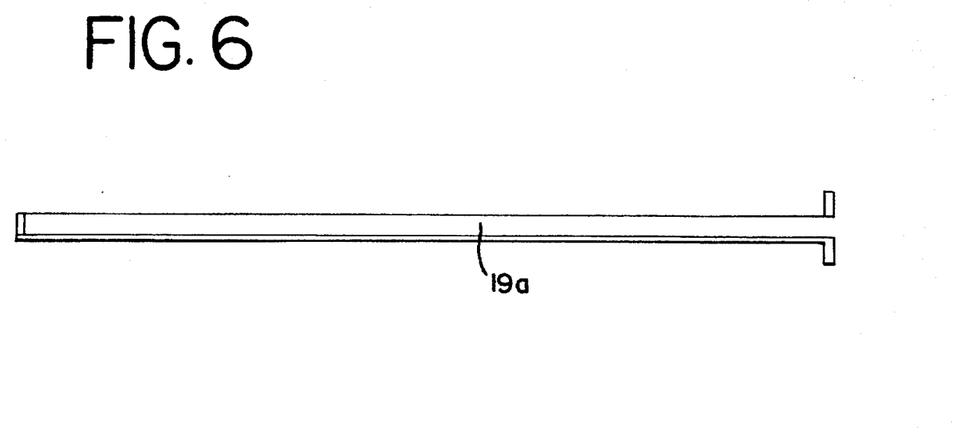
FIG. 6 is a side elevational view of the gas distribution component of the surface cooled crystallizer shown in FIGS. 2 and 3.
Figure 7:
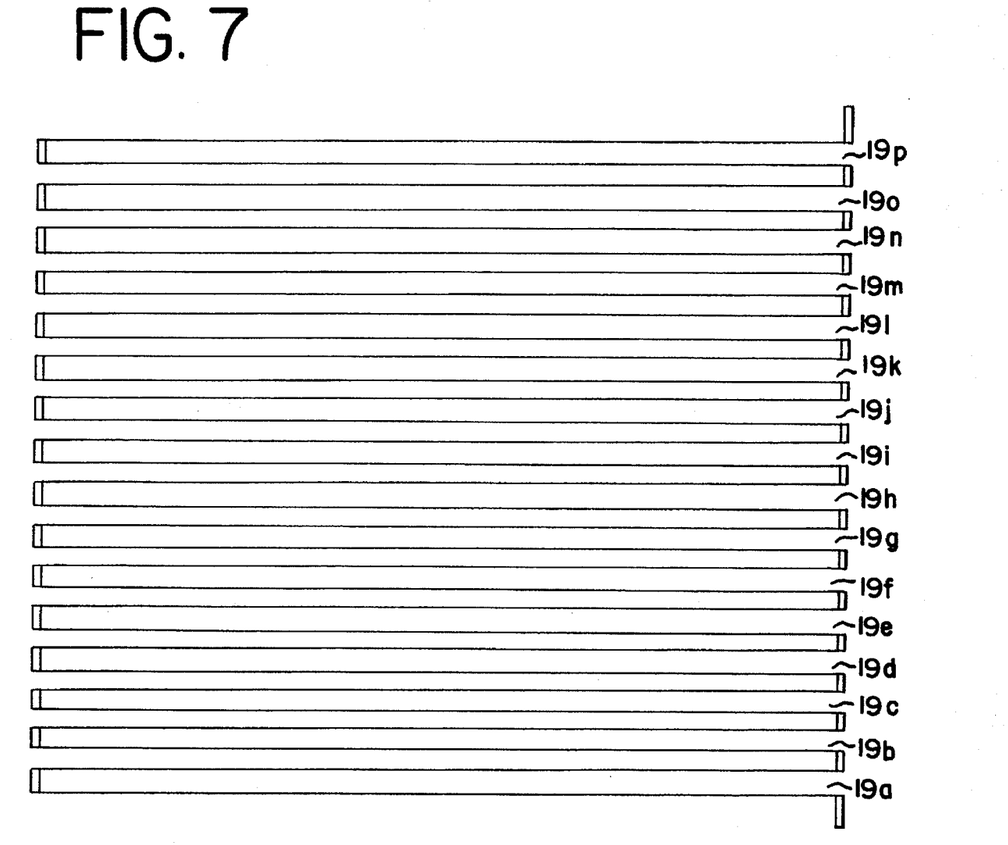
FIG. 7 is a top plan view of the gas distributor component shown in FIG. 6.

Referring to the drawings and, in particular to FIG. 1, a surface-cooled fluid bed crystallizer embodying the present invention is generally designated by the reference numeral 10. Crystallizer 10 includes a tank body 11 which is supplied with liquor from a feed tank (not shown) through a feed inlet 12. Cooling water from a supply tank (not shown) is fed into inlet 13, flows through heat exchanger tube 14 and is recycled through outlet 15 back to the supply tank for regenerative cooling thereof. Air is supplied by a blower 16 through a line 17 into a gas inlet 18 and through a distributor 19 which includes a plurality of orifices (best shown in FIGS. 8 and 9) through which the air is discharged in the form of bubbles that travel upwardly through the slurry body onto and around the tubes 14 of the heat exchanger. An overflow discharge weir 20 is provided for maintaining the slurry level within the tank 11 at a predetermined level and crystal product is recovered from the tank 11 through a slurry discharge outlet 21. Saturated air evolved from the tank 11 at air outlet 22 is returned to the blower 16 through return line 23 and recycled back to air inlet 18.

FIGS. 2–7 illustrate in greater detail certain portions of a surface-cooled crystallizer similar to that shown schematically in FIG. 1. Accordingly, identical reference numerals have been used to designate like components and a detailed description thereof is not necessary. As best shown in FIGS. 2–5, the heat exchanger can be provided with a header 25 that includes an interior receiving chamber 25a, an interior transfer chamber 25b and an interior discharge chamber 25c. Receiving chamber 25a is in flow communication with inlet 13 and directs the flow of the heat exchange medium (e.g. cold water or brine) into the inlet to heat exchange tube portion 14a for passage therethrough into tube portion 14b, flow from tube portion 14b is received in transfer chamber 25b and routed to the inlet of tube portion 14c for flow through tube portions 14c and 14d into interior discharge chamber 25c and for discharge therefrom through outlet 15 to a heat exchange medium regeneration station (not shown).

Correspondingly, a gas distribution header 26 receives air or other suitable gas from line 17 for feeding the inlets to a plurality of gas distributors 19a–p as best shown in FIGS. 2, 3, 6 and 7. Each of these gas distributors is located below a set of heat exchanger tubes for supplying a stream of gas bubbles into the slurry for the upward travel thereof through the slurry onto and around the heat exchange tubes. In this regard, it will be appreciated that while, in the illustrated embodiments, heat exchange tubes are shown, other forms of heat exchange devices such as plates having fluid flow passages therein may be utilized.

Figure 8:
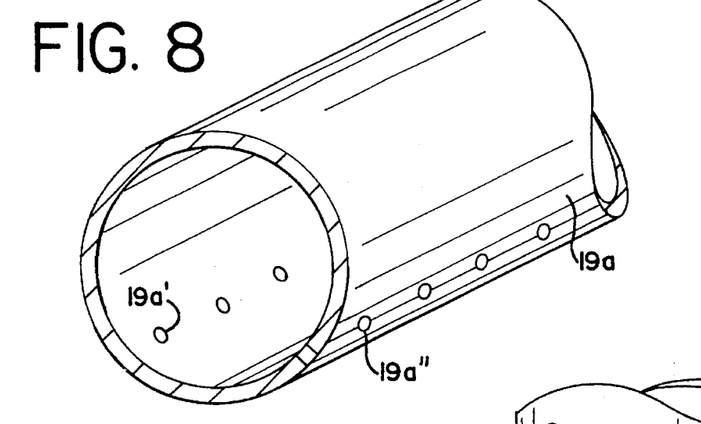
FIG. 8 is a perspective view showing a portion of a gas distributor which can be utilized in crystallizers embodying the present invention.
Figure 9:
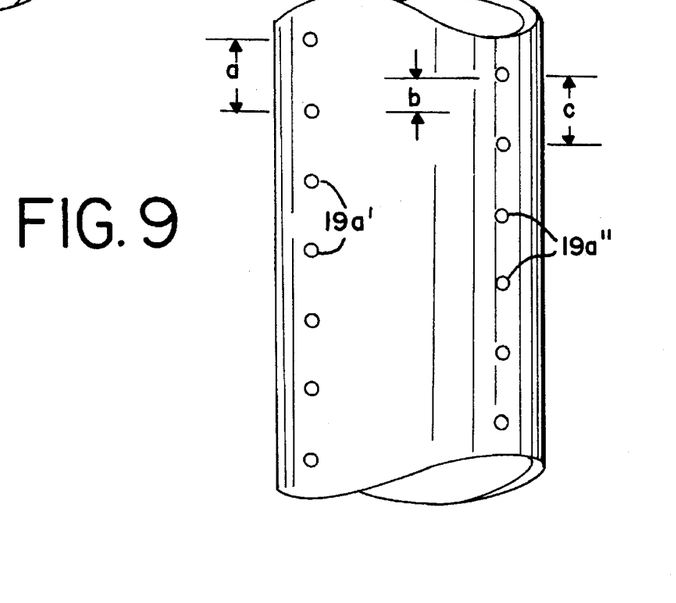
FIG. 9 is a bottom plan view of the portion of the portion of the gas distributor illustrated in FIG. 8.

Air flow rates into the crystallizer system will be dependent upon the density of the slurry/magma, the size and physical characteristics of the crystals being formed, as well as the cross-sectional area of the crystallizer/evaporator body. Generally, air flow rates are employed that produce gas (e.g. air) bubbles of a minimum diameter which will provide the desired gentle agitation of the slurry. It will be appreciated by those skilled in this art that the particular size and spacing of the orifices in the gas distributor 19 will vary in accordance with these parameters and that the present invention, therefore, is not limited to any specific gas distributor diameter dimensions or any specific size or spacing of such orifices. In this regard, however, it has been found that air distributors having an internal diameter of from approximately one-half inch or less to four or more inches in diameter can be used with diameters of from about two to four inches being suitable for most commercial applications. As best shown in FIGS. 8 and 9, the orifices 19a' and 19a" of distributor 19a can be disposed in staggered rows with individual orifices being approximately 1/16 inch in diameter and a center-to-center spacing (designated by the letters "a" and "c" in FIG. 9) in each of such staggered rows of approximately 1/2 inch and a center-to-center "b" spacing between orifices in adjacent rows of approximately 1/4 inch. It will be appreciated that this particular orifice size and orientation is provided for illustrative purposes only and that these dimensions can be varied in accordance with the requirements of the particular application involved.

In systems for crystallization of sodium salts such as sodium carbonate decahydrate and sulfate decahydrate air flow rates of from as low as about 3 to about 30 CFM per sq. ft. of bed will generally be suitable with air flows of from about 10 to about 30 CFM per sq. ft. being preferred. For higher density crystals such as, for example, copper sulphate pentahydrate, higher air flows, typically in the range of from about 10 to about 150 CFM per sq. ft. with air flows of approximately 20 to 70 CFM per sq. ft. being preferred. It will be appreciated that gas flow rates higher than these amounts can be employed, however, such higher flow rates will not typically produce significant improvement in performance and, such higher flow rates will generally be accompanied by increased operating costs. In the case of evaporative crystallizers, however, the higher air velocities will enable a reduction in equipment size.

As previously noted, the advantages of the present invention can also be utilized with reaction type crystallizers in processes which involve both exothermic and endothermic reactions. In such systems, the gas supplied to the distributor is one which will react with the contents of the slurry to produce the desired result. For example, process applications involving exothermic reactions for crystallizers embodying the present invention are illustrated by, but not limited to, the following reactions:

$$CO_{2(g)} + NA_2CO_{3(aq)} + H_2O \rightarrow 2NAHCO_{3(aq)} + HEAT \qquad I$$

$$CO_{2(g)} + NAOH_{(aq)} \rightarrow NAHCO_{3(crystal)} + HEAT \qquad II$$

$$SO_{2(g)} + NA_2CO_{3(aq)} \rightarrow NA_2SO_{3(aq)} + CO_2 + HEAT \qquad III$$

$$2SO_{2(g)} + NA_2CO_{3(aq)} \rightarrow NA_2S_2O_{5(crystal)} + CO_2 + HEAT \qquad IV$$

$$2SO_{2(g)} + NA_2CO_{3(aq)} \rightarrow NA_2S_2O_{5(+CO2)} + HEAT \qquad V$$

$$2NH_{3(g)} + H_2SO_{4(aq)} \rightarrow (NH_4)_2SO_{4(aq)} + HEAT \qquad VI$$

In the above reactions, the gas supplied in reactions I and II will be carbon dioxide, in reactions III, IV and V sulfur dioxide, and in the reaction VI ammonia. As will be appreciated, since such reaction is exothermic, a coolant such as cold water or brine will be supplied to the heat exchange coils or plates.

Correspondingly, the advantages of the present invention can be utilized in reaction type crystallizers wherein a heating, as opposed to a cooling, medium is supplied to the submerged heat exchanger. Illustrative examples of these applications are represented by the following reactions:

$$NA_2SO_4 \cdot 10H_2O_{(s)} + HEAT \rightarrow NA_2SO_{4(s)} + 10H_2O \qquad VII$$

$$NA_2CO_3 \cdot 10H_2O_{(s)} + HEAT \rightarrow NA_2CO_3 \cdot 1H_2O_{(s)} + 9\ H_2O \qquad VIII$$

$$CaSO_3 \cdot 2H_2O + \tfrac{1}{2}O_2 \rightarrow CaSO_4 \cdot \tfrac{1}{2}H_2O + 1\tfrac{1}{2}H_2O \qquad IX$$

Figure 10:
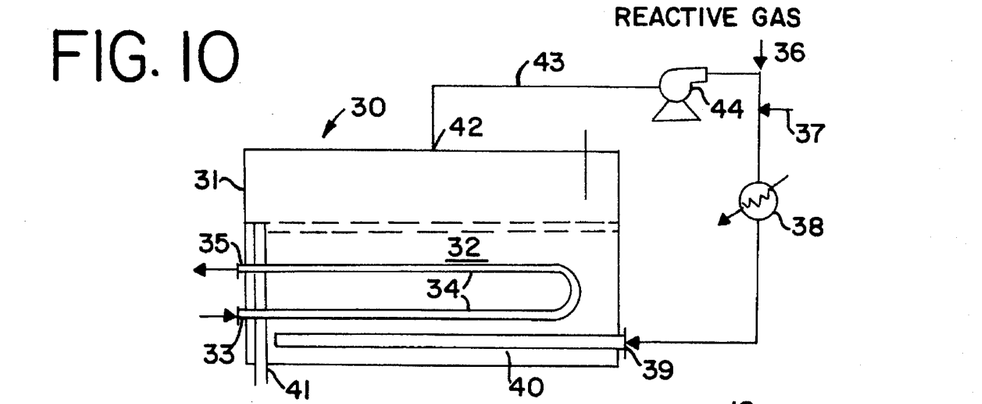
FIG. 10 is a schematic diagram of a reactive type crystallizer embodying features of the present invention.

As illustrated by FIG. 10, the reaction type crystallizer 30 can include a tank body 31 in which a slurry body 32 is contained. A heating or cooling medium, as required by the particular application, is supplied to inlet 33 of submerged heat exchanger 34 and is discharged therefrom via an outlet 35 for recycle and regeneration of the particular medium employed.

Reactive gas from a suitable source (not shown) is supplied to the crystallizer via a process line 36 which, in accordance with an important aspect of the present invention is preferably treated to ensure that it is saturated when it enters the slurry body. As shown in FIG. 10, this saturation can be achieved by the addition of solvent, water or steam at 37 and/or cooling of the reactant gas as shown at 38. The saturated reactant gas is supplied at inlet 39 to a distributor 40 which, as in the case of the previously described embodiments includes a plurality of orifices through which the gas is discharged in the form of bubbles for travel upwardly through the slurry body onto and around the tubes so that it both reacts with the slurry and, at the same time, produces the desired gentle agitation of the slurry body and prevents or minimizes the formation of crystals on the surface of the heat exchanger tubes or plates. Saturated gas evolved from the tank 31 at gas outlet 42 is returned to a blower 44 via a return line 43 for reintroduction into the gas supply line 36. By ensuring that the reactant gas which is supplied to the distributor 40 is saturated, plugging of the orifices in the gas distributor 40 is effectively eliminated or substantially minimized.

Figure 11:
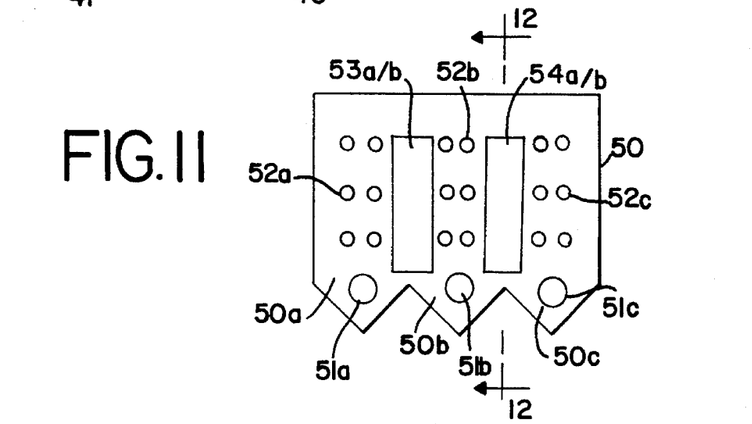
FIG. 11 is a schematic interior view of a multiple-cell crystallizer embodying the present invention equipped with internal baffles.

If desired, internal baffles can be utilized in the crystallizer body to provide for improved performance of the crystallizer. One such arrangement is depicted in FIG. 11 which illustrates a crystallizer body 50 containing three cells 50a, 50b and 50c each of which extends the full length of the crystallizer. As shown, each of these cells includes an air/gas distributor 51a, 51b and 51c which are respectively positioned in underlying relation to a plurality of heat exchange tubes 52a, 52b and 52c all of which are shown in cross-section.

Figure 12:
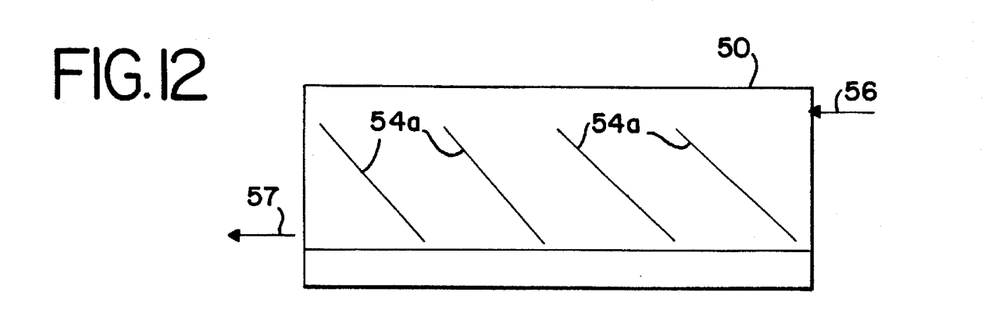
FIG. 12 is a sectional view taken along the line A—A of FIG. 11 illustrating one orientation of the baffles shown in FIG. 11.
Figure 13:
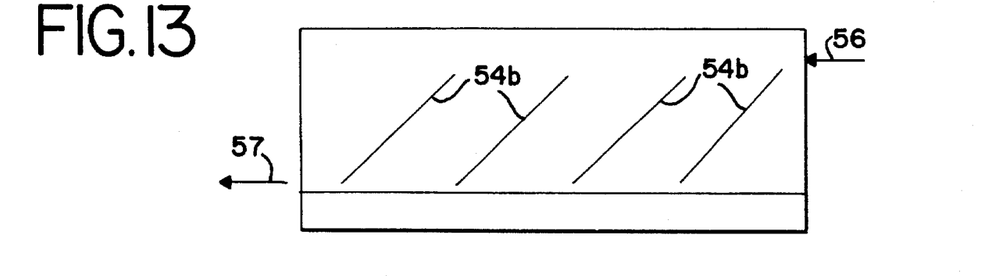
FIG. 13 is a sectional view taken along the line A—A of FIG. 11 illustrating an alternate orientation of the baffles shown in FIG. 11.
Figure 14:
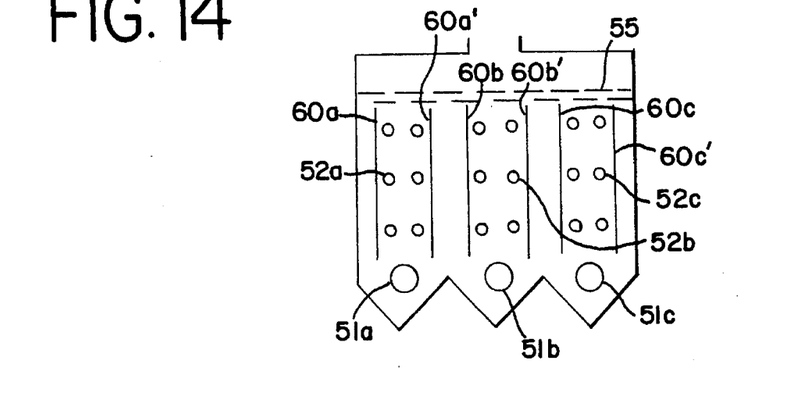
FIG. 14 is a schematic interior view of a multiple cell crystallizer embodying the present invention equipped with another internal baffle orientation.

A plurality of baffles identified by the reference numerals 53a/b and 54a/b are provided in the tank and positioned so that their lower surfaces generally are positioned above the air distributor and their upper surfaces positioned below the slurry level 55. The baffles can be oriented so that they either slant away from the feed inlet as shown in FIG. 12 or towards the feed inlet as shown in FIG. 13. Alternatively, as shown in FIG. 14, the baffles 60a and 60a', 60b and 60b' and 60c and 60c' can be vertically oriented in the tank 50 in generally parallel relation to the array of heat exchanger tubes 52a, 52b and 52c, respectively, running the full length of the crystallizer. In each of these arrangements, the baffles serve to provide a desired effect on the flow within the crystallizer body so as to achieve greater uniformity of slurry concentration along the horizontal axis of the tank 50 at any given level of slurry toward the slurry discharge point.

Figures 15, 16:
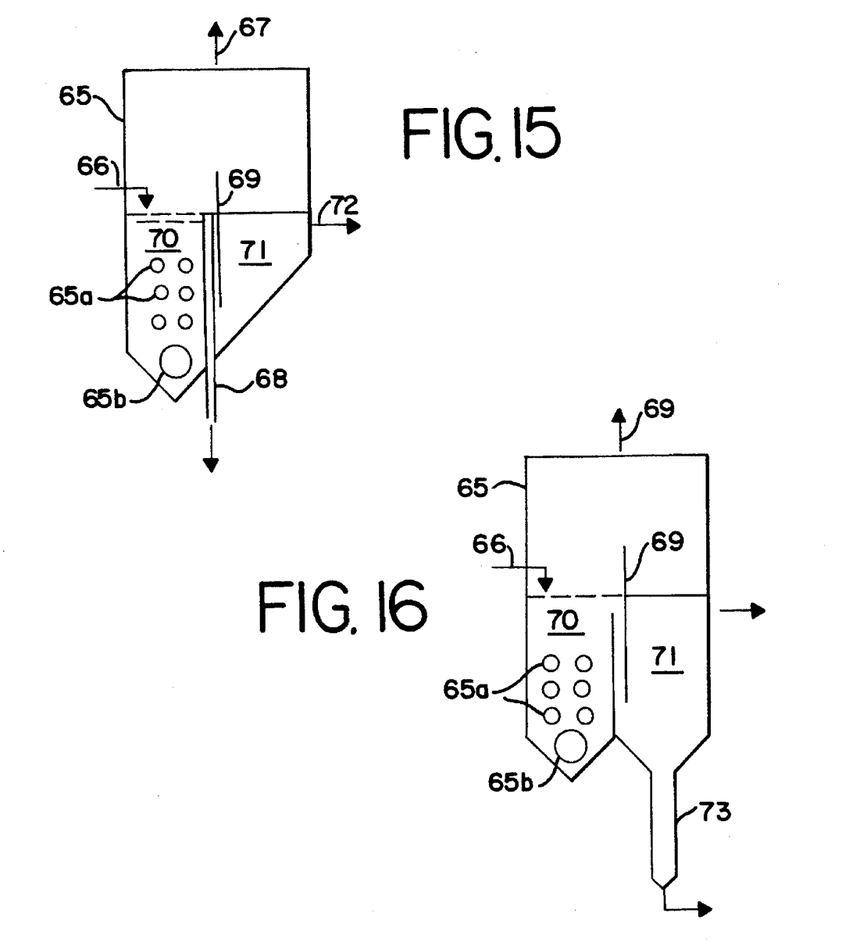

If desired, the features of the present invention can be incorporated into crystallizer systems which incorporate a so-called purge baffle which provides for a thickened slurry in the slurry body portion 70 adjacent the heat exchanger and a quiescent area 71 wherein liquor and crystal fines are removed. For example, as is shown in FIG. 15, crystallizer body 65 is shown having a feed inlet 66 which discharges feed into a slurry body maintained at a desired level therein. A plurality of heat exchange tubes 65a are provided in overlying relation to an air/gas distributor 65b. Gas evolving from the slurry body is discharged through an outlet 67 and a thicken slurry is recovered via slurry discharge 68 outlet. Removal of mother liquor and crystal fines via an outlet 72 results in the formation of crystals of a larger size in the zone 70 of the crystallizer.

As shown in FIG. 16, the crystallizer 65 can be modified by the substitution of an elutriation leg 73 which extends from the lower most portion of the quiescent zone 71 in place of the slurry discharge outlet 68. Elutriation leg 73 provides an alternate arrangement whereby larger crystal particles can be recovered from the system.

The performance of surface cooled fluid bed crystallizers has been evaluated in a number of tests conducted with a variety of such crystallizers. Set forth below are a summary description of the equipment and representative performance data obtained in such tests. These data are provided for illustrative purposes and are not to be construed as a limitation on the scope of the present invention.

|  | UNIT 1 | UNIT 2 | UNIT 3 |
|---|---|---|---|
| VESSEL/HEAT EXCHANGER: | | | |
| TOTAL VOLUME GALLONS OF SLURRY IN TANK | 0.208 | 25 | 50 |
| LIQUID LEVEL (INCHES) | 4 | 15 | 16 |
| TUBE DIAMETER (INCHES) | 0.3125 | 0.625 | 1 |
| TUBE LENGTH (INCHES) | 4 | 60 | 58 |
| NUMBER TUBES | 7 | 5, 10 OR 15 | 4 |
| NUMBER PASSES | 1 | 5 | 4 |
| HEAT TRANSFER SURFACE, (SQ. FT.) | 0.312 | 4.2, 8.5 OR 12.7 | 21 |
| AIR DISTRIBUTOR: | | | |
| AIR FLOW, CFM | 0.307 | 26 TO 42 | 70 TO 140 |
| CFM OF AIR PER SQ. FT. OF BED | 3.68 | 9.6 TO 15.5 | 14 TO 28 |
| TYPE CRYSTALS MADE | $NA_2CO_3 \cdot 10H_2O$ $NA_2SO_4 \cdot 10H_2O$ | $NA_2CO_3 \cdot 10H_2O$ | $NA_2CO_3 \cdot 10H_2O$ |
| HEAT TRANSFER COEFFICIENT BTU/HR./SQ. FT./°F. | 200 TO 280 | 180 TO 400 | 160 TO 270 |
| LMDT,°F. (LOG MEAN DIFFERENTIAL TEMPERATURE) | 7 TO 15 | 7 TO 10 | 7 TO 11 |
| CRYSTAL PRODUCTION RATE LBS/HR. | 0.5 TO 4.6 | 50 TO 90 | 70 TO 140 |

The foregoing test data and data collected in other testing of this invention illustrate that an air distributor-equipped surface-cooled fluid bed crystallizer in accordance with the present invention will provide heat transfer coefficients of 160 to 400 BTU/hr./sq. ft/°F. with log mean temperature differences of 7° to 15° F. By contrast, a forced circulation surface-cooled crystallizer without the air-distribution typically will produce heat transfer coefficients of 75 to 120 BTU/hr./sq. ft./°F. with log mean temperature differences of about 5° to 7.5° F.

While in the foregoing specification, the present invention has been described in reference to a surface-cooled fluid bed crystallizer and a reactive type fluid bed crystallizer, it will be appreciated that modifications and variations to these described embodiments will be apparent to those skilled in this art. Correspondingly, it will be appreciated that the improved heat transfer benefits and other advantages obtainable with this invention can be employed in other crystallization systems wherein submerged heat exchange surfaces are located in a slurry body such as, for example, crystallizers with mechanical agitation and energy transfer requirements (e.g. forced circulation surface cooled crystallizers, Teflon-tube crystallizers, agitated tank cooling crystallizers, and forced-circulation melters). Accordingly, the present invention is to be limited only by the scope of the appended claims.

I claim:

1. A fluid bed crystallizer, said crystallizer comprising:

a vessel adapted to contain a slurry body which includes a supersaturated liquid undergoing crystallization;

a heat exchanger adapted to maintain said slurry at a crystallization facilitating temperature, said heat exchanger being sized and positioned in said vessel so as to be submerged in said slurry body;

means for supplying a heat exchange medium to said heat exchanger;

a gas distributor located in said vessel in underlying relation to said heat exchanger, said gas distributor having a plurality of orifices which are arranged to discharge a stream of gas bubbles upwardly through said slurry body and onto and around the heat transfer surfaces of said heat exchanger;

means for supplying a gas to said gas distributor; and, means for withdrawing a crystal product from said slurry.

2. The fluid bed crystallizer of claim 1 which includes means for collecting gas evolved from said slurry body and for recycling said gas back to said gas distributor.

3. The fluid bed crystallizer of claim 1 wherein said crystallizer is free of mechanical agitation and forced circulation devices.

4. The fluid bed crystallizer of claim 1 wherein said gas is air.

5. The fluid bed crystallizer of claim 1 which further includes means for saturating said gas prior to its being supplied to said gas distributor.

6. The fluid bed crystallizer of claim 1 wherein said gas reacts with one or more components in said slurry.

7. The fluid bed crystallizer of claim 6 which includes means for saturating said reactive gas prior to its being supplied to said distributor.

8. The fluid bed crystallizer of claim 1 wherein said vessel further includes baffles which are sized and positioned in said slurry body for facilitating the formation of larger sized crystal products.

9. The fluid bed crystallizer of claim 1 wherein said heat exchange medium is a coolant for removing heat from said slurry body.

10. The fluid bed crystallizer of claim 1 wherein said heat exchange medium is one which supplies heat to said slurry body.

11. The fluid bed crystallizer of claim 1 wherein said heat exchanger includes heat exchanger tubes which are submerged in said slurry body.

12. The fluid bed crystallizer of claim 1 wherein said heat exchanger includes a plurality of plates having fluid passages therein through which a heat exchange medium is passed.

13. A surface-cooled fluid bed crystallizer, said crystallizer comprising:

a vessel adapted to contain a slurry body which includes a supersaturated liquid undergoing crystallization and crystal particles;

a heat exchanger adapted to maintain said slurry at a crystallization facilitating temperature, said heat exchanger being sized and positioned in said vessel so as to be submerged in said slurry body;

means for supplying a coolant to said heat exchanger;

an air distributor located in said vessel in underlying relation to said heat exchanger, said air distributor having as plurality of orifices which are arranged to discharge a stream of air bubbles upwardly through said slurry body and onto and around the heat transfer surfaces of said heat exchanger;

means for supplying said air to said air distributor;

means for saturating said air prior to its being supplied to said air distributor;

means for collecting air evolved from said slurry body and for recycling said air back to said gas distributor; and, means for withdrawing a crystal product from said slurry.

14. The surface-cooled fluid bed crystallizer of claim 13 wherein said heat exchanger comprises a plurality of heat exchange tubes which are sized and positioned in said vessel so as to be submerged in said slurry body.

15. The surface-cooled fluid bed crystallized of claim 13 wherein said heat exchanger comprises a plurality of plates having fluid passages therein through which said coolant is circulated, the heat transfer surfaces of said plates being sized and positioned in said vessel so as to be submerged in said slurry body.

* * * * *